United States Patent
Wada et al.

(10) Patent No.: US 10,189,983 B2
(45) Date of Patent: *Jan. 29, 2019

(54) CURABLE RESIN COMPOSITION, RESIN MOLD FOR IMPRINTING, METHOD FOR PHOTO IMPRINTING, METHOD FOR MANUFACTURING SEMICONDUCTOR INTEGRATED CIRCUIT, AND METHOD FOR MANUFACTURING FINE OPTICAL ELEMENT

(71) Applicant: TOYO GOSEI CO., LTD., Ichikawa-shi, Chiba (JP)

(72) Inventors: Risa Wada, Ichikawa (JP); Takeshi Osaki, Ichikawa (JP)

(73) Assignee: Toyo Gosei Co., Ltd., Ichikawa-Shi, Chiba (JP)

( * ) Notice: Subject to any disclaimer, the term of this patent is extended or adjusted under 35 U.S.C. 154(b) by 79 days.

This patent is subject to a terminal disclaimer.

(21) Appl. No.: 14/655,047

(22) PCT Filed: Dec. 25, 2013

(86) PCT No.: PCT/JP2013/084614
§ 371 (c)(1),
(2) Date: Sep. 8, 2015

(87) PCT Pub. No.: WO2014/104074
PCT Pub. Date: Jul. 3, 2014

(65) Prior Publication Data
US 2015/0368453 A1    Dec. 24, 2015

(30) Foreign Application Priority Data

Dec. 28, 2012 (JP) ................................ 2012-289008

(51) Int. Cl.
*C08L 33/14* (2006.01)
*G03F 7/00* (2006.01)
(Continued)

(52) U.S. Cl.
CPC ............... *C08L 33/14* (2013.01); *B82Y 10/00* (2013.01); *B82Y 40/00* (2013.01);
(Continued)

(58) Field of Classification Search
CPC ......... C08L 33/14; B82Y 40/00; B82Y 10/00; C08F 299/065; G03F 7/028; G03F 7/0046; G03F 7/0002
See application file for complete search history.

(56) References Cited

U.S. PATENT DOCUMENTS

2007/0275193 A1    11/2007  DeSimone et al.
2009/0281250 A1    11/2009  DeSimone et al.
(Continued)

FOREIGN PATENT DOCUMENTS

JP    2002539604 A    11/2002
JP    2004527782 A     9/2004
(Continued)

OTHER PUBLICATIONS

Koo, machine English translation of JP 2012-518067 (pub Aug. 2012).*
(Continued)

*Primary Examiner* — Jessica M Roswell
(74) *Attorney, Agent, or Firm* — TraskBritt, P.C.

(57) ABSTRACT

A curable resin composition comprising: a fluorinated urethane(meth)acrylate represented by formula (1),
(Continued)

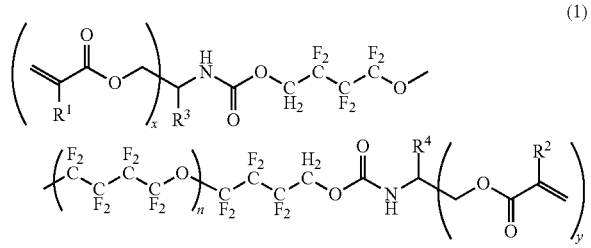

(1)

wherein, $R^1$, $R^2$, $R^3$ and $R^4$ each independently represents a hydrogen atom or a methyl group, x and y each independently represents 1 or 2, and n represents an integer within the range of 1 to 10; $R^3$ and $R^4$ each independently represents the hydrogen atom when x and y are both 1; $R^3$ represents the hydrogen atom and $R^4$ represents the methyl group when x is 1 and y is 2; $R^3$ represents the methyl group and $R^4$ represents the hydrogen atom when x is 2 and y is 1; and $R^3$ and $R^4$ each independently represents the methyl group when x and y are both 2.

9 Claims, 2 Drawing Sheets

(51) Int. Cl.
B82Y 10/00 (2011.01)
G03F 7/004 (2006.01)
G03F 7/027 (2006.01)
C08F 299/06 (2006.01)
B82Y 40/00 (2011.01)
C09D 133/14 (2006.01)

(52) U.S. Cl.
CPC ........ C08F 299/065 (2013.01); C09D 133/14 (2013.01); G03F 7/0002 (2013.01); G03F 7/0046 (2013.01); G03F 7/027 (2013.01); C08L 2312/00 (2013.01)

(56) References Cited

U.S. PATENT DOCUMENTS

2011/0209159 A1 8/2011 Baratz et al.
2012/0060903 A1 3/2012 Fontana et al.
2012/0156510 A1 6/2012 Okafuji et al.
2012/0256354 A1 10/2012 DeSimone et al.
2013/0228950 A1 9/2013 DeSimone et al.

FOREIGN PATENT DOCUMENTS

| JP | 2004351693 A | 12/2004 |
| JP | 2006137021 A | 6/2006 |
| JP | 2007526820 A | 9/2007 |
| JP | 2007527784 A | 10/2007 |
| JP | 2009096927 A | 5/2009 |
| JP | 2010018815 A | 1/2010 |
| JP | 2010033693 A | 2/2010 |
| JP | 2010143092 A | 7/2010 |
| JP | 2012096542 A | 5/2012 |
| JP | 2012518067 A | 8/2012 |
| JP | 2012528217 A | 11/2012 |
| JP | 2014080585 A | 5/2014 |
| JP | 2014091776 A | 5/2014 |
| WO | 0054107 A1 | 9/2000 |
| WO | 0250583 A2 | 6/2002 |
| WO | 2005101466 A | 4/2005 |
| WO | 2005084191 A2 | 9/2005 |
| WO | 2010094661 A1 | 8/2010 |
| WO | 2010136392 A1 | 12/2010 |
| WO | 2010147142 A1 | 12/2010 |
| WO | 2014104074 A1 | 7/2014 |
| WO | 2014136731 A1 | 9/2014 |

OTHER PUBLICATIONS

Kawaguchi Yasuhide, machine English translation of JP 2006-137021 (Year: 2006).*
Desimone, machine English translation of JP 2007-526820 (Year: 2007).*
Tanaka et al., machine English translation of JP 2009-096927 (Year: 2009).*
Rolland et al., High-Resolution Soft Lithography: Enabling Materials for Nanotechnologies, Angew. Chem. Int. Ed., 2004, pp. 5796-5799, vol. 43, Wiley-VCH Verlag GmbH & Co. KGaA, Weinheim, Germany.
U.S. Appl. No. 14/773,268 with common inventors filed Sep. 4, 2015.
PCT Written Opinion, PCT/JP2013/084614, dated Apr. 15, 2014.
PCT International Search Report, PCT/JP2013/084614, dated Apr. 15, 2014.
Morizawa et al., Fluorine Chemistry at Asahi Glass, Present and Future, Res. Reports Asahi Glass Co., Ltd., 57, 2007.
Japanese Notification of Reasons for Refusal for Patent Application No. 2015-504302, dated Apr. 11, 2018.

* cited by examiner

CURABLE RESIN COMPOSITION, RESIN MOLD FOR IMPRINTING, METHOD FOR PHOTO IMPRINTING, METHOD FOR MANUFACTURING SEMICONDUCTOR INTEGRATED CIRCUIT, AND METHOD FOR MANUFACTURING FINE OPTICAL ELEMENT

CROSS-REFERENCE TO RELATED APPLICATIONS

This application is a national phase entry under 35 U.S.C. § 371 of International Patent Application PCT/JP2013/084614, filed Dec. 25, 2013, designating the United States of America and published in Japanese as International Patent Publication WO 2014/104074 A1 on Jul. 3, 2014, which claims the benefit under Article 8 of the Patent Cooperation Treaty and under 35 U.S.C. § 119(e) to Japanese Patent Application Serial No. 2012-289008, filed Dec. 28, 2012, the disclosure of each of which is hereby incorporated herein in its entirety by this reference.

TECHNICAL FIELD

An aspect of this disclosure relates to a curable resin composition that is preferable for preparing a resin mold for imprinting, a resin mold for imprinting using the curable resin composition, and a method for photo imprinting using the resin mold.

BACKGROUND

In recent years, in the manufacture of semiconductor integrated circuits and fine optical elements, technologies for processing fine patterns has further become important, and one of such technology is an imprinting method.

The imprinting method is a technology for transferring a fine pattern to a surface of a substrate by pressing a mold having a concavo-convex pattern that corresponds to a fine pattern that is desired to be formed on the surface of the substrate (hereinafter referred to as a "mold") against a material to be transferred/formed on the surface of the substrate. A fine pattern of a nano-order can be formed by this technology.

As the imprinting method, a photo imprinting method and a thermal imprinting method are known depending on the difference in the physical properties of materials to be transferred and processing methods. Among these, a photo imprinting method using a photocurable resin composition as the material to be transferred gains attention since the method has advantages making heating unnecessary, deformation of a pattern is little since the pattern can be formed at room temperature, and the positions of the substrate and mold are easily adjusted by using a transparent mold (for example, Patent Literature 1).

Molds that are generally used in this imprinting method include molds formed of quartz and metals such as nickel. In a mold made of quartz, a pattern is formed on a quartz substrate or the like by a semiconductor fine processing technology such as photolithography or etching. A mold made of a metal is formed by performing metal plating by using an electric casting (electroforming) method (for example, a nickel plating method) on a surface of a mold made of quartz, and peeling off this plated metal layer.

However, the molds prepared by such methods had problems making them very expensive and requiring long periods for the preparation.

Under such circumstances, a mold obtained by transferring a pattern on a resin by using the above-mentioned mold as a master mold, and using this as a mold made of a resin, is disclosed.

The following Non-patent Literature 1 discloses a resin mold prepared by using a photocurable resin composition formed of a fluorinated urethane methacrylate represented by the following formula and a photopolymerization initiator. However, regarding the disclosed resin mold, Non-patent Literature 1 does not describe the durability of the resin mold in the case when transferring is repetitively performed by using the resin mold. In addition, according to a test by the inventors, it was proven that the above-mentioned resin mold is not sufficient with respect to the durability in the case when transferring is repetitively performed by using the resin mold.

Formula 1

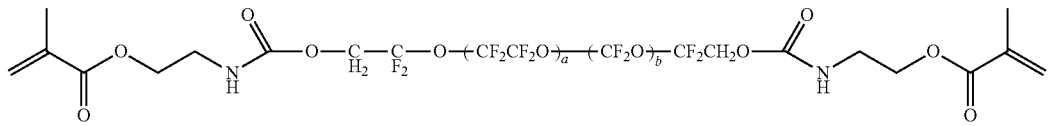

CITATION LIST

Patent Literature

Patent Literature 1: Japanese Unexamined Patent Application Publication JP 2002-539604

Non-Patent Literature

Non-patent Literature 1: Jason P. Rolland et al., Angew. Chem. Int. Ed. 2004, 43, P5796-5799 (Germany)

BRIEF SUMMARY

Technical Problem

Considering such situation, an object of some aspects of this disclosure is to provide a curable resin composition from which a resin mold can endure repetitive transfer onto a transferred material layer can be prepared, a resin mold for imprinting prepared by using the curable resin composition, and a photo imprinting method using the resin mold.

Solution to Problem

The present applicants made various considerations so as to solve the above-mentioned problem, and consequently found that a curable resin composition containing a photocurable component in a specific scope is preferable for preparing a resin mold for photo imprinting, which can solve the above-mentioned problem, and attained the above-mentioned aspect of this disclosure.

Such first aspect of this disclosure resides in a curable resin composition that is characterized by containing a fluorinated urethane(meth)acrylate represented by formula (1). As used in this specification, "fluorinated urethane (meth)acrylate" means that it includes a fluorinated urethane acrylate, a fluorinated urethane methacrylate, or both.

Formula 2

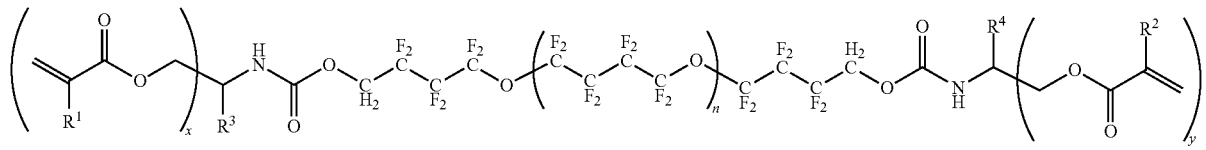

(1)

wherein, $R^1$, $R^2$, $R^3$ and $R^4$ each independently represents a hydrogen atom or a methyl group, x and y each independently represents 1 or 2, and n represents an integer within the range of 1 to 10; $R^3$ and $R^4$ each independently represents the hydrogen atom when x and y are both 1; $R^3$ represents the hydrogen atom and $R^4$ represents the methyl group when x is 1 and y is 2; $R^3$ represents the methyl group and $R^4$ represents the hydrogen atom when x is 2 and y is 1; and $R^3$ and $R^4$ each independently represents the methyl group when x and y are both 2.

The second aspect of this disclosure resides in the curable resin composition according to the first aspect characterized by having photocurability.

The third aspect of this disclosure resides in the curable resin composition according to the second aspect characterized by containing a photopolymerization initiator.

The fourth aspect of this disclosure resides in a resin mold for imprinting characterized by being obtained by curing the curable resin composition according to any of the first to third aspects.

The fifth aspect of this disclosure resides in a method for photo imprinting characterized in that photo imprinting is performed by using the resin mold for imprinting according to the fourth aspect.

The sixth aspect of this disclosure resides in a method for manufacturing a semiconductor integrated circuit characterized in that the above-mentioned resin mold for imprinting is used.

The seventh aspect of this disclosure resides in a method for manufacturing a fine optical element characterized in that the above-mentioned resin mold for imprinting is used.

Advantageous Effects of Disclosure

According to an aspect of this disclosure, a curable resin composition that is excellent in mold release property with a transferred material layer, excellent in durability of the resin mold itself, and can prepare a resin mold that can last through repetitive transfer to a transferred material layer, by forming a curable resin composition containing a specific compound as a cure component, and a resin mold for imprinting using the curable resin composition can be provided. Little deterioration is seen when that resin mold is used in photo imprinting, thus, a preferable photo imprinting method in which the resin mold is repetitively used can be attained.

DETAILED DESCRIPTION

Figure 1:
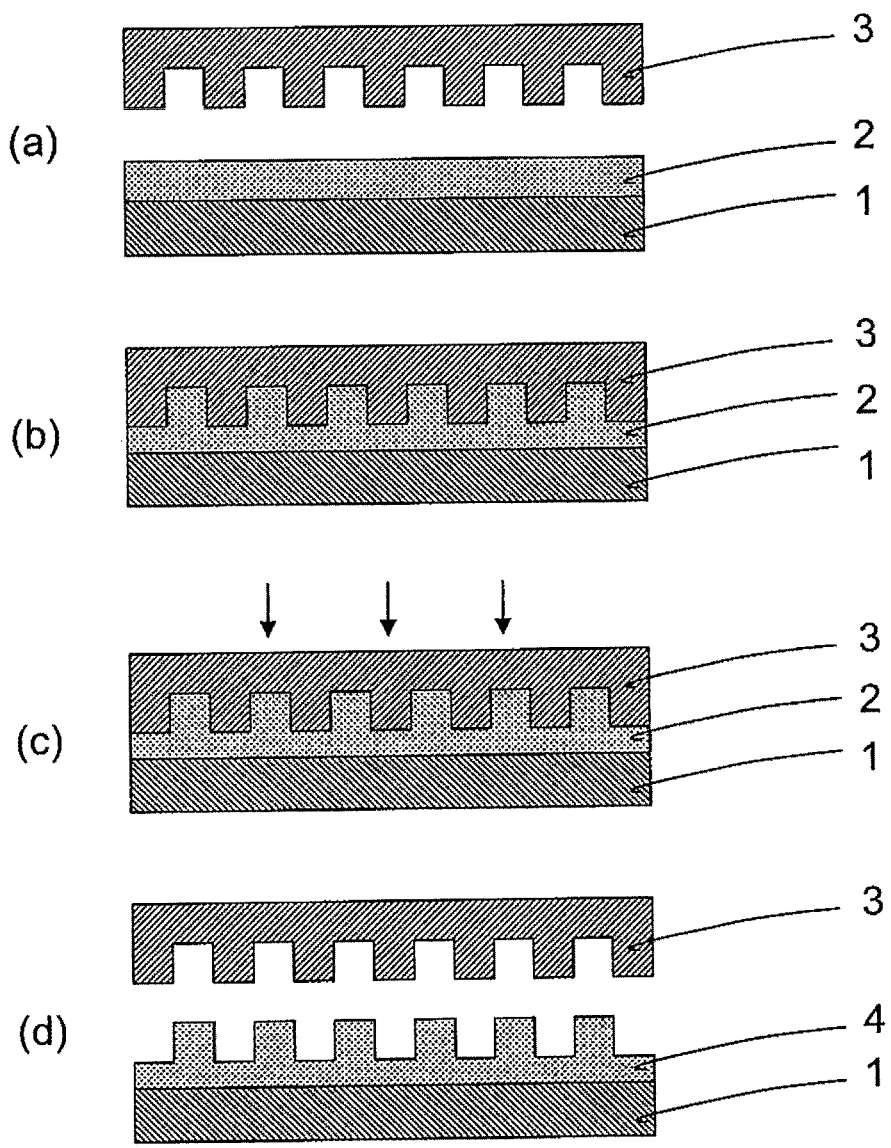
FIG. 1, panels (a) to (d), are drawings illustrating a method for preparing the resin mold for photo imprinting in an aspect of this disclosure.

The curable resin composition in an aspect of this disclosure contains a fluorinated urethane(meth)acrylate represented by the above-mentioned formula (1).

In the formula, $R^1$, $R^2$, $R^3$ and $R^4$ each independently represents a hydrogen atom or a methyl group, x and y each independently represents 1 or 2, and n represents an integer within the range of 1 to 10; $R^3$ and $R^4$ each independently represents the hydrogen atom when x and y are both 1; $R^3$ represents the hydrogen atom and $R^4$ represents the methyl group when x is 1 and y is 2; $R^3$ represents the methyl group and $R^4$ represents the hydrogen atom when x is 2 and y is 1; and $R^3$ and $R^4$ each independently represents the methyl group when x and y are both 2.

When n is 0, the content of the fluorine in the molecule is small, and the mold release property of the resin mold obtained by using that curable resin composition against a transferred material layer tends to be deteriorated. When n is more than 10, in the case when a polymerization initiator and the like that are added as necessary are mixed and used, the curable resin composition tends to not be preferable since it has poor affinity and easily becomes cloudy.

As is apparent from the Examples and Comparative Examples mentioned below, the resin mold produced by using a cured resin composition in an aspect of this disclosure, containing the fluorinated urethane(meth)acrylate represented by the above-mentioned formula (1) is significantly excellent in mold release property with a transferred material layer and is excellent in the durability of the resin mold itself as compared to the resin mold using the photocuring resin composition using the fluorinated urethane methacrylate of Non-patent Literature 1. It is presumed that this is due to the fact that fluorinated urethane(meth)acrylate in an aspect of this disclosure contained in the curable resin composition has a repeating structure of a fluorinated polytetramethylene glycol.

Although the method for producing the fluorinated urethane(meth)acrylate in an aspect of this disclosure, represented by the above-mentioned formula (1), is not especially limited, for example, the fluorinated urethane(meth)acrylate can be produced as follows.

The fluorinated urethane(meth)acrylate is obtained by reacting an isocyanate containing a (meth)acroyl group and a fluorinated polytetramethylene glycol represented by the following formula (2) in the presence of a catalyst as necessary. As used in this specification, "(meth)acroyl group" means an acroyl group, a methacroyl group, or both is/are encompassed.

Formula 3

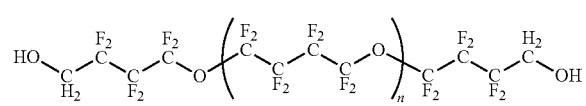

(2)

In the formula, n represents an integer of 1 to 10. Furthermore, examples of the isocyanate containing a (meth)acroyl group include "KARENZ™" manufactured by Showa Denko K. K. (for example, KARENZAOI™, KARENZMOI®, KARENZBEI™, and KARENZMOI-EG™.

Examples of the fluorinated polytetramethylene glycol represented by the above-mentioned formula (2) include "Fluorinated PTMG250 DIOL," "Fluorinated PTMG650 DIOL," and the like, manufactured by Exfluor Research, and these commercial products are mixtures containing the fluorinated polytetramethylene glycol wherein n in the above-mentioned formula (2) is an integer of 1 to 10 as a main component.

The ratio for reacting the isocyanate containing a (meth)acroyl group and the fluorinated polytetramethylene glycol is not especially limited, and ratio is, for example, isocyanate containing a (meth)acroyl group:fluorinated polytetramethylene glycol=1:0.8 to 1.2 (molar ratio). They may be reacted in the absence of a solvent or in the presence of a solvent. In the case when a reaction solvent is used, examples of the reaction solvent include 1,4-dioxane, tetrahydrofuran, toluene, fluorinated ethers (for example, "NOVEC®" manufactured by Sumitomo 3M Limited (for example, NOVEC® 7100, 7200 and 7300), "GALDEN®" manufactured by Solvay Specialty Polymers Japan K. K. (for example, GALDEN® SV70, SV90 and SV110)) and the like. Furthermore, examples of the catalyst include catalysts for general urethane synthesis such as dibutyltin dilaurate. The reaction conditions are, for example, a reaction temperature of from 40° C. to 80° C. and a reaction time of 2 to 5 hours.

Furthermore, the curable resin composition in an aspect of this disclosure becomes a resin cured product by photocuring or thermal curing, and is preferably a photocurable resin composition for use in the production of a resin mold for imprinting, and preferably contains a photopolymerization initiator together with the fluorinated urethane(meth)acrylate represented by the above-mentioned formula (1).

The content of the compound represented by the above-mentioned formula (1) in the photocurable resin composition is not especially limited, and is preferably from 10 to 99.9% by mass, more preferably 50 to 99.9% by mass in the photocurable resin composition. When the content becomes lower than 10% by mass, the fluorine content in the photocurable resin composition is small, the mold release property of the obtained photocured product tends to be low, and the durability is also low. Furthermore, when the content becomes more than 99.9% by mass, the incorporation ratio of the photopolymerization initiator decreases, and the curability of the photocurable resin composition tends to decrease.

Examples of the photopolymerization initiator that is preferable for incorporating in the photocurable resin composition include the following known and conventionally used photopolymerization initiators.

Acetophenone-based photopolymerization initiators: acetophenone, 3-methylacetophenone, 4-t-butyl-dichloroacetophenone, 2,2-diethoxyacetophenone and the like.

Benzoin-based photopolymerization initiators: benzyl, benzoin, benzoin methyl ether, benzoin isopropyl ether, 2-hydroxy-2-methyl-1-phenyl-1-propanone, 1-(4-isopropylphenyl)-2-hydroxy-2-methylpropan-1-one and the like.

Benzophenone-based photopolymerization initiators: benzophenone, benzoylbenzoic acid, 4-phenylbenzophenone, hydroxybenzophenone, (1-hydroxycyclohexyl)phenylmetanone and the like.

Thioxanthone-based photopolymerization initiators: thioxanthone, 2-methylthioxanthone, diethylthioxanthone, 2-chlorothioxanthone and the like.

Anthraquinone-based photopolymerization initiators: anthraquinone, 2-ethylanthraquinone and the like.

Ketal-based photopolymerization initiators: acetophenone benzyl ketal, benzyl dimethyl ketal and the like.

Other photopolymerization initiators: diphenyl-2,4,6-trimethyldibenzoylphosphineoxide, α-acyloxime ester, camphorquinone and the like.

Examples of commercially available photopolymerization initiators include "IRGACURE®" (for example, IRGACURE® 184, 127, 369, 651, 500, 819, 907, 784, 2959, OXE01, OXE02, CGI-1700, -1750, -1850 and CG24-61) manufactured by BASF, "DAROCUR®" (for example, DAROCUR® 1116 and 1173), "LUCIRIN®" (for example, LUCIRIN® TPO, LR8893 and LR8970), "Ubecryl" manufactured by UCB (for example, Ubecryl P36) and "ESA-CURE®" (for example, ESACURE® KIP150 and ONE) manufactured by LAMBERTI S.p.A, and the like.

Furthermore, where necessary, a sensitizer can be added to the photopolymerization initiator. Examples of the sensitizer include cyanine-based pigments, merocyanine-based pigments, coumarin-based pigments, benzylidene ketone-based pigments, (thio)xanthene-based pigments, squalium-based pigments, (thia)pyrrilium-based pigments, porpholines, triethylamine, diethylamine, N-methyldiethanolamine, ethanolamine, 4-dimethylaminobenzoic acid, methyl 4-dimethylaminobenzoate, ethyl 4-dimethylaminobenzoate, isoamyl 4-dimethylaminobenzoate and the like, and examples of the commercially available sensitizers include "KAYACURE" manufactured by Nippon Kayaku Co., Ltd. (for example, KAYACURE ITX, QTX, CPTX and DETX-S) and "Ubecryl" manufactured by UCB (for example, Ubecryl P102, 103, 104 and 105), and the like.

The incorporation amount of the photopolymerization initiator to be incorporated in the photocurable resin composition in an aspect of this disclosure is not especially limited, and is preferably from 0.01 to 10% by mass, more preferably, from 0.1 to 7% by mass in the photocurable resin composition. This is because when the incorporation amount is 10% by mass or less, the curing property of the photocurable resin composition and the kinetic property and optical property, handling and the like of the photocured product are fine, and when the incorporation amount is 0.01% by mass or more, the curing velocity of the photocurable resin composition is fine.

In addition, another (meth)acrylate may be incorporated in the curable resin composition in an aspect of this disclosure in the scope in which the properties thereof are not deteriorated.

Furthermore, the curable resin composition in an aspect of this disclosure may contain a thermal polymerization initiator. Examples of the thermal polymerization initiator include peroxides, azo compounds, azide compounds and diazo compounds, and specific examples include benzoyl peroxide, t-butyl-peroxybenzoate, azobis compounds such as azobisisobutyronitrile, azide benzaldehyde, azidebenzalmethylcyclohexanones, azobisisobutyronitrile and dimethyl 2,2'-azobis(2-methylpropionate), aromatic diazonium salts, naphthoquinone diazide compounds, and the like.

Furthermore, the curable resin composition in an aspect of this disclosure may contain an additive (mold release agent) that enables obtainment of a cured product having a better mold release property. As the additive, fluorine-based additives are especially preferable, and examples include "NOVEC®" manufactured by Sumitomo 3M Limited (for example, NOVEC® FC-4430 and FC-4432), "DSN-403N" manufactured by Daikin Industries, Ltd. "Megafac" manufactured by DIC Corporation (for example, Megafac F-470, F-475, F-477, RS-72-K, RS-75, EXP. TF-1540 and EXP. TF-1760).

The curable resin composition in an aspect of this disclosure may contain another additive. Examples of the another additive include antioxidants, ultraviolet absorbers, photostabilizers, silane-coupling agents, coating surface-improving agents, thermal polymerization inhibitors, levelling agents, surfactants, preservation stabilizers, plasticizers, lubricants, solvents, fillers, anti-aging agents, wettability-improving agents and the like.

Examples of the antioxidants include "IRGANOX®" manufactured by BASF (for example, IRGANOX® 1010, 1035, 1076, 1222 and 1520L), "Antigen" manufactured by Sumitomo Chemical Co., Ltd. (for example, Antigen P, 3C, FR and GA-80), and "Adekastab" manufactured by ADEKA CORPORATION (for example, Adekastab AO-50, AO-60, HP-10 and AO-412S), and the like.

Examples of the ultraviolet absorbers include "TINUVIN®" manufactured by BASF (for example, TINUVIN® P, 234, 320, 326, 327, 328, 329 and 213) and "SEESORB®" manufactured by Shipro Kasei Kaisha, Ltd. (for example, SEESORB® 102, 103, 110, 501, 202, 712 and 704), and the like.

Examples of the commercially available photostabilizers include "TINUVIN®" manufactured by BASF (for example, TINUVIN® 292, 144 and 622LD), "SANOL™" manufactured by SANKYO CO., LTD (for example, SANOL™ LS770), "Sumisorb TM-061" manufactured by Sumitomo Chemical Co., Ltd., "FA-711MM" manufactured by Hitachi Chemical Co., Ltd. and "Adekastab" manufactured by ADEKA CORPORATION (for example, Adekastab LA-72, LA-81 and LA-82), and the like.

Examples of the silane-coupling agent include γ-aminopropyltriethoxysilane, γ-mercaptopropyltrimethoxysilane and γ-metaacryloxypropyltrimethoxysilane, and commercially available products include "SH6062" and "SH6030" manufactured by Dow Corning Toray Co., Ltd., and "KBM" manufactured by Shin-Etsu Chemical Industry Co., Ltd. (for example, KBM 903, 603, 503 and 403), and the like.

By performing a step of pressing a master mold having concave and convex that corresponds to a fine pattern against the curable resin composition layer in an aspect of this disclosure formed on the surface of the substrate, or by performing a step of putting the curable resin composition in an aspect of this disclosure on a master mold having concave and convex that corresponds to a fine pattern by a method such as dropwise addition or application, putting a substrate thereon, and sandwiching and pressing the curable resin composition layer by the substrate and the master mold, a fine pattern is transferred to the curable resin composition layer, and the curable resin composition is cured by irradiating with light, thereby a resin mold for imprinting can be obtained. Furthermore, since the resin mold for imprinting in an aspect of this disclosure contains the fluorinated urethane (meth)acrylate represented by the above-mentioned formula (1), the mold has a fine mold release property against the material to be transferred in the imprinting method, and is excellent in durability in repetitive use and transfer.

The method for preparing the resin mold for photo imprinting in this disclosure and the photo imprinting method using the resin mold for photo imprinting in an aspect of this disclosure will be explained by using FIG. 1, Panel (a), to FIG. 2, Panel (b).

Specifically, first, as shown in FIG. 1, Panel (a), a master mold 3 on which a transparent substrate 1 and a concavo-convex pattern have been formed is prepared, a photocurable resin layer 2 in an aspect of this disclosure formed of the photocurable resin composition in an aspect of this disclosure is formed on the substrate 1, and as shown in FIG. 1, Panel (b), the photocurable resin layer 2 in an aspect of this disclosure is sandwiched between the substrate 1 and the master mold 3, and the concavo-convex pattern of the master mold 3 is filled with the photocurable resin composition in an aspect of this disclosure (filling step). In FIG. 1, Panels (a) to (d), although the substrate 1 on which the photocurable resin layer 2 in an aspect of this disclosure has been formed is described, the photocurable resin layer 2 in an aspect of this disclosure may be disposed on the master mold 3, or may be disposed on both the substrate 1 and the master mold 3.

The substrate 1 may be such that the photocurable resin layer 2 in an aspect of the present disclosure can be disposed by application, dropwise addition or the like of the photocurable resin composition in an aspect of this disclosure, and a substrate that transmits ultraviolet is suitable.

Examples include transparent inorganic substrates such as glasses, quartz and sapphire, and synthetic resin substrates such as ceramic substrates, polycarbonates, PETs (polyethylene telephthalates) and triacetyl cellulose. Furthermore, the surface of the substrate 1 may have undergone a pretreatment for improving the adhesion with the photocurable resin layer 2 in an aspect of this disclosure, improving the application state of the photocurable resin layer 2 in an aspect of this disclosure, and the like. Specific examples of the pretreatment include surface modification by wet system surface washing, plasma, ozone washing or the like, a treatment with an adhesion-improving agent such as a silane-coupling agent, and the like.

The method for forming the photocurable resin layer 2 in an aspect of this disclosure on the substrate 1 or the master mold 3 is not especially limited, and examples include application and dropwise addition of the photocurable resin composition in an aspect of this disclosure that is diluted with a solvent or the like as necessary, and specific examples include spin coating, roll coating, dip coating, gravure coating, die coating, curtain coating, inkjet application and dispenser application, and the like.

The thickness of the photocurable resin layer 2 in an aspect of this disclosure may be preset with consideration for the amount of the photocurable resin composition filled in the concave part of the concavo-convex pattern formed on the master mold 3, such as the depth of the concave part of the concavo-convex pattern. Furthermore, the photocurable resin layer 2 in an aspect of this disclosure may be disposed so as to cover the whole surfaces of the master mold 3 and the substrate 1, or may be disposed so as to cover only a part.

It is sufficient that a desired concavo-convex pattern has been formed on the surface of the master mold 3. Examples of the material of the master mold 3 include transparent materials such as quartz glass and synthetic resins such as PDMS (polydimethylsiloxane), and materials that do not allow transmission of light such as metals and metal oxides such as silicon, silicon carbide, silicon oxide and nickel, and the like. The appearance of the master mold 3 may be similar to the appearance of a mold used in a general photo imprinting method, for example, the appearance may be a cuboid shape or a roll shape.

Furthermore, in order to make the mold release property fine, the master mold 3 may be such that the surface of the master mold 3 has undergone a mold release treatment. The mold release treatment can be performed by using a known mold release treatment agent as exemplified by perfluoro-based or hydrocarbon-based polymer compounds, alkoxysilane compounds or trichlorosilane compounds, diamond-like carbon and the like, by a vapor phase method, a liquid phase method or the like. Examples of the commercially available fluorine-based mold release treatment agents include "OPTOOL®" manufactured by Daikin Industries, Ltd. (for example, OPTOOL®, DSX, HD1100Z and HD2100Z) and the like.

Furthermore, the concavo-convex pattern formed on the surface of the master mold 3 may be similar to, but is not limited to, a concavo-convex pattern formed on the surface of a mold used in a general photo imprinting method. For example, the master mold 3 on which a concave part has been formed may be formed by forming a depression on the surface of the material of the master mold 3 and, in this case, a part that projects relatively to the side of the surface becomes a convex part. Alternatively, the master mold 3 on which a convex part has been formed may be formed by providing a projection on the surface of the material of the master mold 3 and, in this case, a part that sinks relatively in the inner side becomes a concave part. Alternatively, by using a master disc having a concavo-convex pattern formed by disposing a depression or a projection on the surface of the material of the master disc, the master mold 3 formed by using this master disc as a template may be formed. The shape of the cross-sectional surface of each concave part in the concavo-convex pattern may be a square shape, a rectangle shape, a triangle shape, a half-moon shape, or a shape that is similar to those shapes, or the like, and each concave part may have, for example, a depth of about 0.00001 to 3 mm, and a diameter of an opening of about 0.00001 to 5 mm.

The photocurable resin layer 2 in an aspect of this disclosure formed of the photocurable resin composition in an aspect of this disclosure is formed on the substrate 1 or master mold 3 by this way, the substrate 1 and master mold 3 are opposed, the photocurable resin layer 2 and the surface on which the concavo-convex pattern has been formed of the master mold 3 are brought into contact as shown in FIG. 1, Panel (b), and the concavo-convex pattern of the master mold 3 is filled with the photocurable resin layer (the photocurable resin composition in an aspect of this disclosure). Where necessary, a force of about 0.01 to 10 MPa may be applied in filling the master mold 3 with the photocurable resin layer 2 in an aspect of this disclosure. In addition, an imprinting apparatus in a conventional photo imprinting method can be used.

Subsequently, as shown in FIG. 1, Panel (c), the photocurable resin layer 2 in an aspect of this disclosure and the master mold 3 are brought into contact, the photocurable resin layer 2 is cured by exposing to light in a state that the concavo-convex pattern of the master mold 3 is filled with the photocurable resin layer 2 in an aspect of this disclosure, whereby a resin mold 4 is formed (a photocuring step).

The light source used in the exposure to light may be any light source that can irradiate light at which the photocurable resin composition is cured, for example, light at a wavelength of from 200 to 500 nm, and it is necessary that the light is a light at a wavelength at which the light transmits the substrate 1 or master mold 3. Examples of the light source include low-pressure mercury lamps, high-pressure mercury lamps, ultra-high-pressure mercury lamps, metal halide lamps, xenon lamps, carbon arc, mercury xenon lamps, excimer lasers such as XeCl and KrF, ultraviolet or visible light lasers, and ultraviolet or visible light LEDs, and the like. The irradiance level of the light may be any amount at which the photocurable resin layer can be cured. In carrying out an aspect of this disclosure, the irradiance level may be generally selected within the range of from 10 mJ/cm$^2$ to 500 J/cm$^2$, and differs depending on the composition of the photocurable resin composition in an aspect of this disclosure to be prepared, or the thickness of the layer, and the like. The photocurable resin layer 2 in an aspect of this disclosure is irradiated with light from the side of the element that is substantially transparent against the irradiated light among the substrate 1 and the master mold 3.

Secondly, as shown in FIG. 1, Panel (d), the master mold 3 is released from the resin mold 4 in an aspect of this disclosure, and the resin mold 4 in an aspect of this disclosure is peeled off from the substrate 1 as necessary, whereby the resin mold 4 in an aspect of this disclosure on which the concavo-convex pattern on the master mold 3 has been inverted and transferred can be formed.

The method for using the obtained resin mold 4 in an aspect of this disclosure is not especially limited, and can be used in, for example, a method for producing a photocured product by using the resin mold in an aspect of this disclosure and the photocurable resin composition for forming a pattern in a photo nano-imprinting method.

Figure 2:
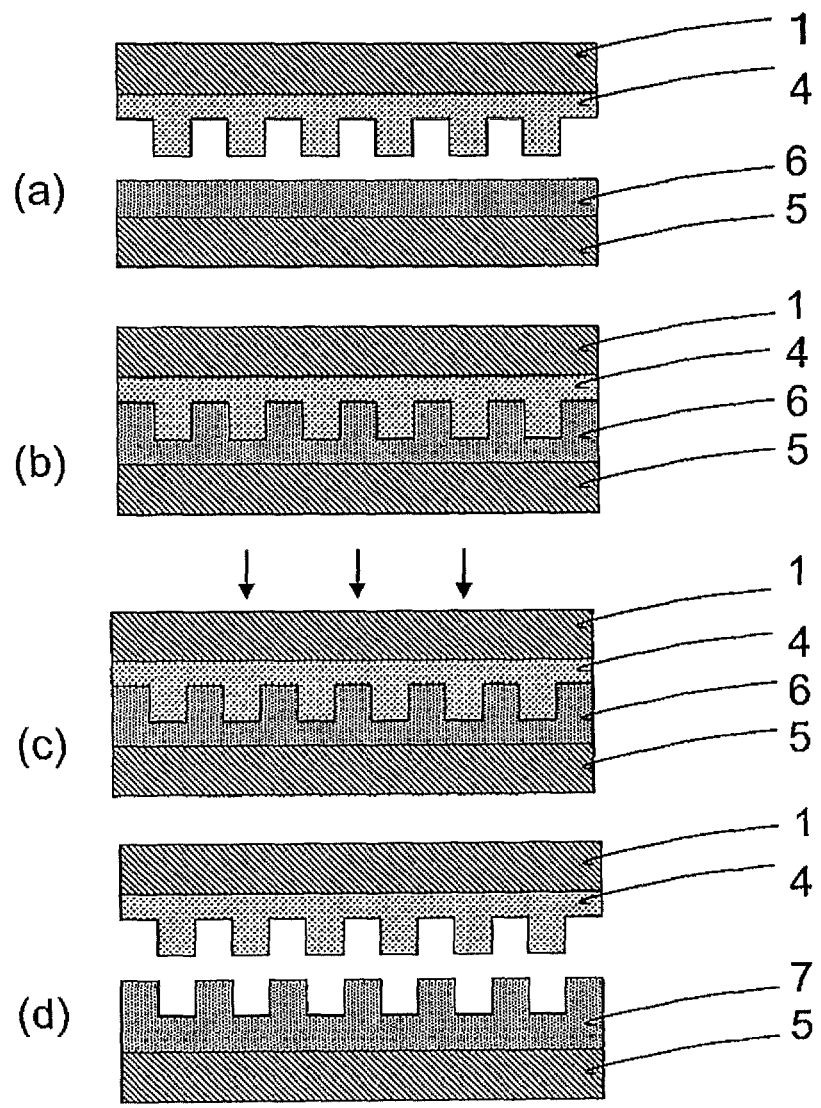
FIG. 2, panels (a) to (d), are drawings illustrating a method for producing a photocured product by using the resin mold in an aspect of this disclosure and the photocurable resin composition for forming a pattern.

Specifically, first, as shown in FIG. 2, Panel (a), a substrate 5 and the resin mold 4 in an aspect of this disclosure on which the concavo-convex pattern has been formed are prepared, a curable resin layer for forming a pattern (transferred material layer) 6 formed of the photocurable resin composition for forming a pattern is formed on the substrate 5, and as shown in FIG. 2, Panel (b), the photocurable resin layer 6 for forming a pattern is sandwiched by the substrate 5 and the resin mold 4 in an aspect of this disclosure, whereby the photocurable resin composition for forming a pattern is filled in the concavo-convex pattern of the resin mold 4 in an aspect of this disclosure (filling step). Although the substrate 5 on which the photocurable resin layer 6 for forming a pattern has been formed is described in FIG. 2, Panel (b), the photocurable resin layer 6 for forming a pattern may be disposed on the resin mold 4 in an aspect of this disclosure, or disposed on both the substrate 5 and the resin mold 4 in an aspect of this disclosure.

The substrate 5 may be any substrate on which the photocurable resin layer 6 for forming a pattern can be disposed by application, dropwise addition, or the like, of the photocurable resin composition and, for example, the substrate may be a substrate that is used in a general photo imprinting method. Specific examples include semiconductor substrates such as silicon wafers, compound semiconductors such as GaAs, InAs and GaN, transparent inorganic substrates such as glass, quartz and sapphire, ceramic substrates, synthetic resin substrates such as polycarbonates, PETs (polyethylene telephthalates) and triacetyl cellulose, metals or metal oxides, and the like. Furthermore, examples of the transparent substrate 5 include glass substrates, quartz substrates, sapphire substrates, transparent synthetic resin substrates, and the like. In addition, the surface of the substrate 5 may have undergone a pretreatment for the improvement of the adhesion to the photocurable resin layer 6 for forming a pattern, the improvement of the application state of the photocurable resin layer 6 for forming a pattern, and the like. Specific examples of the pretreatment include surface modification by wet surface washing, plasma, ozone washing, and the like, a treatment by adhesion-improving agents such as a silane-coupling agent, and the like.

The method for forming the photocurable resin layer 6 for forming a pattern on the substrate 5 or the resin mold 4 is not especially limited, and examples include application and dropwise addition of the photocurable resin composition in an aspect of this disclosure, which has been diluted with a solvent or the like as necessary, and specifically include spin coating, roll coating, dip coating, gravure coating, die coating, curtain coating, inkjet application and dispenser application, and the like.

The thickness of the photocurable resin layer 6 for forming a pattern may be preset with consideration for the amount of the photocurable resin composition filled in the concave part of the concavo-convex pattern formed on the resin mold 4, for example, the depth of the concave part of the concavo-convex pattern, and the like. Furthermore, the photocurable resin layer 6 for forming a pattern may be disposed so as to cover the entire surfaces of the resin mold 4 and the substrate 5, or so as to cover only a part.

The appearance of the resin mold 4 may be similar to the appearance of the master mold 3 that is used in a general photo imprinting method and, for example, the appearance may be a cuboid form or a roll form.

Furthermore, a concavo-convex pattern that has been inverted from the master mold 3 has been formed as the concavo-convex pattern formed on the surface of the resin mold 4.

filling the photocurable resin layer 6 for forming a pattern in the resin mold 4, a force of about 0.01 to 10 MPa may be applied as necessary. In addition, an imprinting apparatus in a conventional photo imprinting method can be used.

Subsequently, as shown in FIG. 2, Panel (c), the photocurable resin layer 6 for forming a pattern and the resin mold 4 are brought into contact, and the photocurable resin layer 6 for forming a pattern is cured by exposing to light in a state that the concavo-convex pattern of the resin mold 4 is filled with the photocurable resin layer 6 for forming a pattern, whereby a photocured layer 7 is formed (a photocuring step).

Examples of the light source used in the exposure to light include light sources that are similar to those used in the photocuring step in the preparation of the above-mentioned resin mold 4. The irradiance level of the light may be an amount that enables the curing of the photocurable resin layer. In carrying out an aspect of this disclosure, it is preferable to select the irradiance level generally within the range of from 10 mJ/cm$^2$ to 10 J/cm$^2$, and the irradiance level differs depending on the composition of the photocurable resin layer to be cured, or the thickness of the layer, and the like.

The photocurable resin layer 6 for forming a pattern is irradiated with light from the side of the element that is substantially transparent against the irradiated light among the substrate 5 and the resin mold 4.

Furthermore, as shown in FIG. 2, Panel (d), the resin mold 4 is released from the photocured layer 7, and the photocured layer 7 is peeled off from the substrate 5 as necessary, whereby the photocured layer 7 on which the concavo-convex pattern of the resin mold 4 has been transferred can be formed.

EXAMPLES

An aspect of this disclosure will further be specifically explained below within the following Examples. This disclosure is not limited to the following Examples.

Example 1

Synthesis of Fluorinated Urethane Methacrylate A Represented by Following Formula (3)

Formula 4

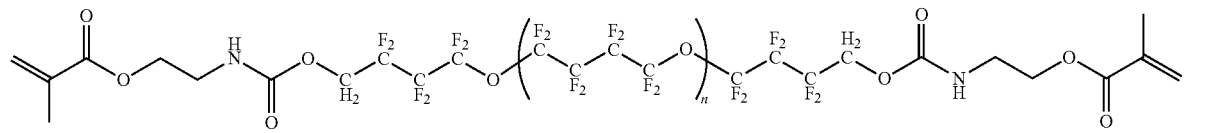

(3)

The photocurable resin layer 6 for forming a pattern formed of the photocurable resin composition for forming a pattern is formed on the substrate 5 or the resin mold 4, the substrate 5 and the resin mold 4 are then opposed, and as shown in FIG. 2, Panel (b), the photocurable resin layer 6 for forming a pattern and the surface on which the concavo-convex pattern has been formed of the resin mold 4 are brought into contact, and the concavo-convex pattern of the resin mold 4 is filled with a photocurable resin layer (photosensitive resin composition) for forming a pattern. In 51.2 g (0.028 mol) of a fluorinated polytetramethylene glycol represented by the above-mentioned formula (2) ("Fluorinated PTMG650 DIOL" manufactured by Exfluor Research Corp), 7.18 g (0.046 mol) of 2-methacroyloxyethylisocyanate ("KARENZMOI®" manufactured by Showa Denko K. K.), and 8 mg of dibutyltin dilaurate as a catalyst were added to a three-necked flask equipped with a water-cooling condenser, and dissolved to give a solution.

The molecular weight of the fluorinated polytetramethylene glycol represented by the above-mentioned formula (2)

was calculated by $^{19}$F NMR with referring to the method of a non-patent literature (*Macromol. Chem. Phys.* 198, 1893-1907 (1997)). The result of NMR with respect to the fluorinepolytetramethylene glycol was as follows:

$^{19}$F NMR (376 MHz, C$_6$F$_6$/DMSO-d, 25° C., ppm)

σ: −110.725 (m, —CF$_2$CF$_2$CF$_2$CH$_2$OH), σ: −108.885 (m, —OCF$_2$CF$_2$CF$_2$CF$_2$O—), σ: −106.075 (m, —CF$_2$CH$_2$OH), σ: −66.655 (m, —OCF$_2$CF$_2$CF$_2$CF$_2$O— and —OCF$_2$CF$_2$CF$_2$CH$_2$OH)

The number n of the repeating structure (—CF$_2$CF$_2$CF$_2$CF$_2$O—) of the fluorinated polytetramethylene glycol is represented by n=S/2 when the integrated value of the fluorine in (—CF$_2$CH$_2$OH) obtained by $^{19}$F NMR is deemed as 1, and the integrated value of the fluorine in (—CF$_2$CF$_2$CF$_2$CF$_2$O—) is deemed as S.

From the result of $^{19}$F NMR, when the integrated value of the fluorine of σ: −106.075 (m, —CF$_2$CH$_2$OH) was deemed as 1.0, the integrated value of the fluorine of σ: −110.725 (m, —CF$_2$CF$_2$CF$_2$CH$_2$OH) was 1.0, the integrated value of the fluorine of σ: −108.885 (m, —OCF$_2$CF$_2$CF$_2$CF$_2$O—) was 8.3, and the integrated value of the fluorine of σ: −66.655 (m, —OCF$_2$CF$_2$CF$_2$CF$_2$O— and —OCF$_2$CF$_2$CF$_2$CH$_2$OH) was 10.0. From the ratio of these integrated values, the integrated value of the fluorine of the site of (—OCF$_2$CF$_2$CF$_2$CH$_2$OH) can be calculated to be 3.0, and the sum of the integrated values of the fluorine of the fluorinated polytetramethylene glycol can be calculated to be 20.3 (average value). The difference between the sum of the integrated values of the fluorinated polytetramethylene glycol and the integrated value of the fluorine of the site of (—OCF$_2$CF$_2$CF$_2$CH$_2$OH) was the value of the integrated value S of the fluorine of the repeating structure part (—CF$_2$CF$_2$CF$_2$CF$_2$O—) of the fluorinated polytetramethylene glycol, and S=17.3 (average value). As a result of the calculation of the value of n of the repeating structure parts of the fluorinated polytetramethylene glycol from the above-mentioned formula, n=8.65 (average value), and the molecular weight of the fluorinated polytetramethylene glycol was 2246 (average value).

Furthermore, the above-mentioned obtained solution was stirred at 70° C. for 4 hours to give a fluorinated urethane methacrylate A. The structure of the obtained fluorinated urethane methacrylate A was confirmed by an NMR spectrum. The result was as follows:

$^1$H NMR (400 MHz, CD$_3$COCD$_3$, 25° C., ppm)

σ: 1.893 (s, —CH$_3$), σ: 3.496-3.509 (m, CH$_2$NHCO), σ: 4.204-4.230 (m, CH$_2$OCO), σ: 4.720 (m, CF$_2$—CH$_2$O), σ: 5.595-5.599 (m, CCH$_3$—CH$_2$), σ: 6.084 (s, CCH$_3$—CH$_2$), σ: 6.984 (s, NHCH$_2$)

$^{19}$F NMR (376 MHz, C$_6$F$_6$/DMSO-d, 25° C., ppm)

σ: −110.691, σ: −109.066, σ: −104.299, σ: −97.946, σ: −66.641

Preparation of Photocurable Resin Composition A1

98% by mass of the fluorinated urethane methacrylate A, and 2% by mass of (1-hydroxycyclohexyl)phenylmetanone ("IRGACURE® 184" manufactured by BASF) as a photopolymerization initiator were stirred and mixed at room temperature to prepare a photocurable resin composition A1.

Preparation of Resin Mold MA1

First, the photocurable resin composition A1 was added dropwise with a dropper onto a quartz mold (length 50 mm, width 50 mm, thickness 1 mm) that had undergone a mold release treatment with a commercially available fluorine-based mold release treatment agent ("OPTOOL® HD1100Z" manufactured by Daikin Industries, Ltd.) and on which a fine concavo-convex pattern had been formed. Subsequently, a non-alkali glass substrate (length 50 mm, width 50 mm, thickness 1 mm) was pressed against the photocurable resin composition A1 from above. In this state, an even load of a pressure of 0.05 kN was applied by using an imprinting apparatus (ST02 manufactured by Toshiba Machine Co., Ltd.), the substrate and the photocurable resin composition A1 were retained under a state of pressurization of 0.05 kN for 60 seconds and exposed to light from the side of the non-alkali glass substrate by using an LED light source that irradiates light at a wavelength of 365 nm under a nitrogen atmosphere, whereby the photocuring of the photocurable resin composition A1 was performed. At this time, gap control was conducted so that the gap between the quartz mold and the non-alkali glass became 500 μm by putting five sheets of polyethylene telephthalate films (PET films), each having a thickness of 100 μm, into the gap between the quartz mold and the non-alkali glass substrate, so as not to touch the photocurable resin composition A1. The light amount for the exposure was 3000 mJ/cm$^2$. The quartz mold was peeled off after the photocuring, whereby a resin mold MA1 having a thickness of 500 μm, which had been formed on the non-alkali glass substrate and had a fine concavo-convex pattern, was obtained.

Preparation of a Photocurable Resin Composition Q to be Transferred

86% by mass of 2-ethylhexyl acrylate (manufactured by Kyoeisha Chemical Co., Ltd.) as a photopolymerizable compound, 10% by mass of trimethylolpropane triacrylate (manufactured by Kyoeisha Chemical Co., Ltd.), and 4% by mass of 2-hydroxy-2-methyl-1-phenyl-1-propanone ("DAROCUR® 1173" manufactured by BASF) as a photopolymerization initiator were stirred and mixed at room temperature to prepare a photocurable resin composition Q to be transferred.

Evaluation of Transfer Durability of Resin Mold MA1

The photocurable resin composition Q to be transferred was added dropwise to the resin mold MA1 as prepared above on the non-alkali glass substrate. A PET film was then put on the photocurable resin composition Q to be transferred from above. The photocurable resin composition Q to be transferred was sandwiched by the PET film and the above-mentioned resin mold MA1. The photocurable resin composition Q to be transferred was cured by exposing to light with 1 J/cm$^2$ of ultraviolet ray by using an ultra-high-pressure mercury lamp from the side of the PET film surface to form a transferred material layer, and the transferred material layer was peeled off from the resin mold MA1.

The series of operations including dropwise addition of the above-mentioned photocurable resin composition Q, exposure to light and peeling off (durability test) were repeated, whether or not roughness is observed on the surface of the resin mold MA1 was visually observed, and the transfer durability of the resin mold was evaluated from the result as follows.

The generation of roughness on the mold surface is caused by the decrease in the mold release property of the mold based on the deterioration of the mold, and the like. When roughness is observed on the mold surface, roughness is observed on the surface of the obtained transferred material layer, and thus the transferred material layer cannot be said to be a transferred material layer having a fine concavo-convex pattern.

⊙ (Fine); roughness is absent on the surface of the mold after performing durability tests 200 times.

○ (Slightly fine); roughness generated on the surface of the mold after performing durability tests 51 to 200.

▲ (Poor); roughness generated on the surface of the mold after performing durability tests 10 to 50 times.

X (Significantly poor); roughness generated on the surface of the mold after performing durability tests 2 to 9 times.

In the case when the resin mold MA1 prepared from the photocurable resin composition A1 was used, roughness was not observed on the surface of the resin mold MA1 even after performing durability tests 200 times and, thus, the resin mold MA1 prepared from the photocurable resin composition A1 showed a fine transfer durability (⊙) (see Table 1).

Example 2

Preparation of Photocurable Resin Composition A2

98% by mass of the fluorinated urethane methacrylate A, and 2% by mass of 2-hydroxy-2-methyl-1-phenyl-1-pro-

Example 4

Synthesis of Fluorinated Urethane Acrylate B Represented by Following Formula (4)

Formula 5

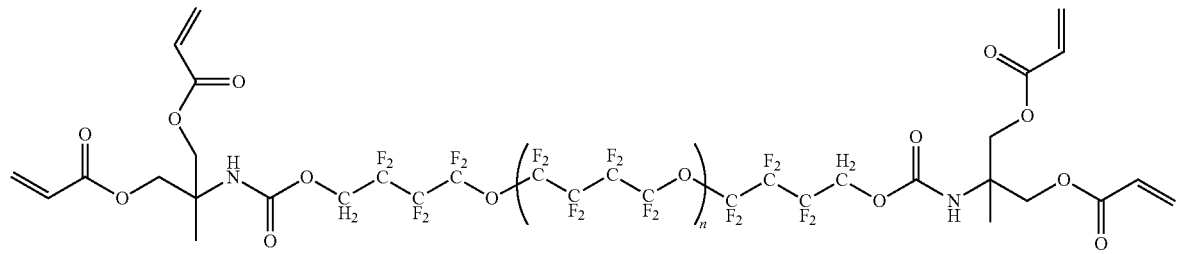

(4)

panone ("DAROCUR® 1173" manufactured by BASF) as a photopolymerization initiator were stirred and mixed at room temperature to prepare a photocurable resin composition A2.

Preparation of Resin Mold MA2

The resin mold MA2 was prepared by a similar method to that of Example 1, except that the composition was set to the composition shown in Table 1.

Evaluation of Transfer Durability of Resin Mold MA2

Roughness on the surface was not observed on the surface of the resin mold MA2 even after performing durability tests about the resin mold MA2 200 times by using the resin mold MA2 prepared from the photocurable resin composition A2 and the photocurable resin composition Q as a material to be transferred by a similar method to that of Example 1 and, thus, the resin mold MA2 prepared from the photocurable resin composition A2 showed a fine transfer durability (☉) (see Table 1).

Example 3

Preparation of Photocurable Resin Composition A3

98% by mass of the fluorinated urethane methacrylate A, and diphenyl-2,4,6-trimethylbenzoylphosphineoxide ("LUCIRIN® TPO" manufactured by BASF) as a photopolymerization initiator were stirred and mixed at room temperature to prepare a photocurable resin composition A3.

Preparation of Resin Mold MA3

The resin mold MA3 was prepared by a similar method to that of Example 1, except that the composition was the composition shown in Table 1.

Evaluation of Transfer Durability of Resin Mold MA3

Roughness was not observed on the surface of the resin mold MA3 even after performing durability tests about the resin mold MA3 200 times by using the resin mold MA3 prepared from the photocurable resin composition A3 and the photocurable resin composition Q as a material to be transferred by a similar method to that of Example 1 and, thus, the resin mold MA3 prepared from the photocurable resin composition A3 showed a fine transfer durability (☉) (see Table 1).

3.76 g (0.00208 mol) of a fluorinated polytetramethylene glycol represented by the above-mentioned formula (2) ("Fluorinated PTMG650 DIOL" manufactured by Exfluor Research Corp), 0.813 g (0.00340 mol) of 1,1-(bisacryloyloxymethyl)ethylisocyanate ("KARENZ® BEI" manufactured by Showa Denko K. K.), and 4 mg of dibutyltin dilaurate as a catalyst were put into a three-necked flask equipped with a water-cooling condenser, and dissolved. This solution was then stirred at 70° C. for 8 hours to give a fluorinated urethane acrylate B. The structure of the obtained fluorinated urethane acrylate B was confirmed by an NMR spectrum. The result was as follows:

$^1$H NMR (400 MHz, CD$_3$COCD$_3$, 25° C., ppm)

σ: 1.461 (s, CH$_3$), σ: 4.389 (m, CH$_2$NHCO), σ: 4.700 (m, CF$_2$—CH$_2$O), σ: 5.900 (m, CH—CH$_2$), σ: 6.180 (m, CH—CH$_2$), σ: 6.366 (s, CH—CH$_2$), σ: 6.994 (s, NHCH$_2$)

$^{19}$F NMR (376 MHz, C$_6$F$_6$/DMSO-d, 25° C., ppm)

σ: −110.730, σ: −109.081, σ: −104.601, σ: −97.917, σ: −66.651

Preparation of Photocurable Resin Composition B

68% by mass of the fluorinated urethane methacrylate A, 30% by mass of the fluorinated urethane acrylate B, and 2% by mass of (1-hydroxycyclohexyl)phenylmetanone ("IRGACURE® 184" manufactured by BASF) as a photopolymerization initiator were stirred and mixed at room temperature to prepare a photocurable resin composition B.

Preparation of Resin Mold MB

The resin mold MB was prepared by a similar method to that of Example 1, except that the composition was the composition shown in Table 1.

Evaluation of Transfer Durability of Resin Mold MB

Roughness was not observed on the surface of the resin mold MB even after performing durability tests about the resin mold MB 200 times by using the resin mold MB prepared from the photocurable resin composition B and the photocurable resin composition Q as a material to be transferred by a similar method to that of Example 1 and, thus, the resin mold MB prepared from the photocurable resin composition B showed a fine transfer durability (☉) (see Table 1).

Comparative Example 1

Preparation of Photocurable Resin Composition Y

98% by mass of a fluorinated urethane methacrylate Y represented by the following formula (5) ("FLUOROLINK® MD700" manufactured by Solvay Specialty Polymers Japan K. K.: molecular weight 1500), and 2% by mass of (1-hydroxycyclohexyl)phenylmetanone ("IRGACURE® 184" manufactured by BASF) as a photopolymerization initiator were stirred and mixed at room temperature to prepare a photocurable resin composition Y.

Formula 6

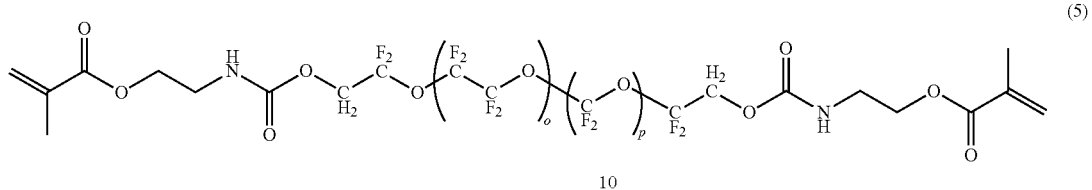

(5)

Preparation of Resin Mold MY

The resin mold MY was prepared by a similar method to that of Example 1, except that the composition was the composition shown in Table 1.

Evaluation of Transfer Durability of Resin Mold MY

When durability tests about the resin mold MY were repeated by using the resin mold MY prepared from the photocurable resin composition Y and the photocurable resin composition Q as a material to be transferred by a similar method to that of Example 1, roughness generated on the surface of the resin mold MY after performing durability tests 10 to 50 times and, thus, the transfer durability of the resin mold MY was poor (▲) (see Table 1).

Comparative Example 2

Preparation of Photocurable Resin Composition Z

98% by mass of a fluorinated urethane methacrylate Z represented by the following formula (6) ("FOMBLIN® MD40" manufactured by Solvay Specialty Polymers Japan K. K.: molecular weight 4000), and 2% by mass of (1-hydroxycyclohexyl)phenylmetanone ("IRGACURE® 184" manufactured by BASF) as a photopolymerization initiator were stirred and mixed at room temperature to prepare a photocurable resin composition Z.

Formula 7

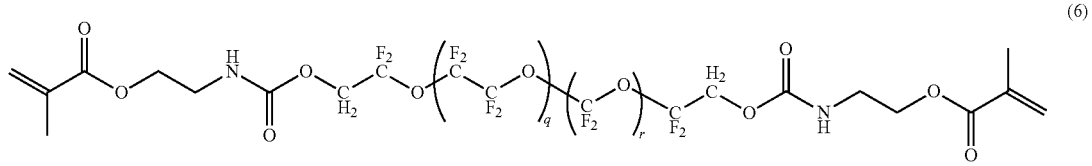

(6)

Preparation of Resin Mold MZ

The resin mold MZ was prepared by a similar method to that of Example 1, except that the composition was the composition shown in Table 1.

Evaluation of Transfer Durability of Resin Mold MZ

When durability tests about the resin mold MZ were repeated by using the resin mold MZ prepared from the photocurable resin composition Z and the photocurable resin composition Q as a material to be transferred by a similar method to that of Example 1, roughness generated on the surface of the resin mold MZ after performing durability tests 2 to 9 times and, thus, the transfer durability of the resin mold MZ was significantly poor (X) (see Table 1).

TABLE 1

| | | | Example 1 | Example 2 | Example 3 | Example 4 | Comparative Example 1 | Comparative Example 2 |
|---|---|---|---|---|---|---|---|---|
| Photocurable component | photopolymerizable compound | Fluorinated urethane methacrylate A | 98 | 98 | 98 | 68 | | |
| | | Fluorinated urethane acrylate B | | | | 30 | | |
| | | Fluorinated urethane methacrylate Y *1) | | | | | 98 | |
| | | Fluorinated urethane methacrylate Z *2) | | | | | | 98 |
| | photopolymerization initiator | (1-hydroxy cyclohexyl)phenylmethanone *3) | 2 | | | 2 | 2 | 2 |
| | | 2-hydroxy-2-methyl-1-phenyl-1-propanone *4) | | 2 | | | | |

TABLE 1-continued

| | Example 1 | Example 2 | Example 3 | Example 4 | Comparative Example 1 | Comparative Example 2 |
|---|---|---|---|---|---|---|
| Diphenyl-2,4,6-trimethylbenzoyl phosphineoxide *5) | | | 2 | | | |
| Evaluation of transfer-durability of resin mold | ◎ | ◎ | ◎ | ◎ | ▲ | X |

*1) "FLUOROLINK ® MD700" manufactured by Solvay Specialty Polymers Japan
*2) "FLUOROLINK ® MD40" manufactured by Solvay Specialty Polymers Japan
*3) "IRGACURE ® 184" manufactured by BASF
*4) "DAROCUR ® 1173" manufactured by BASF
*5) "LUCIRIN ® TPO" manufactured by BASF

The invention claimed is:

1. A curable resin composition comprising:

a fluorinated urethane(meth)acrylate represented by formula (1),

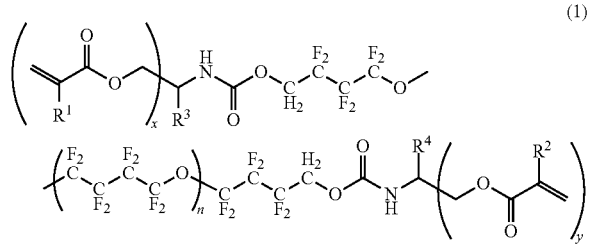

(1)

wherein:

each of $R^1$, $R^2$, $R^3$ and $R^4$ independently represents a hydrogen atom or a methyl group, x and y each independently represents 1 or 2, and n represents an integer within the range of 1 to 10;

each of $R^3$ and $R^4$ independently represents the hydrogen atom when x and y are both 1;

$R^3$ represents the hydrogen atom and $R^4$ represents the methyl group when x is 1 and y is 2;

$R^3$ represents the methyl group and $R^4$ represents the hydrogen atom when x is 2 and y is 1; and each of $R^3$ and $R^4$ independently represents the methyl group when x and y are both 2.

2. The curable resin composition according to claim 1, having photocurability.

3. The curable resin composition according to claim 2, comprising a photopolymerization initiator.

4. A resin mold for imprinting, produced by curing the curable resin composition according to claim 1.

5. A method for manufacturing a semiconductor integrated circuit, the method comprising:

utilizing the resin mold of claim 4 to manufacture the semiconductor integrated circuit.

6. A method for manufacturing a fine optical element, the method comprising:

utilizing the resin mold of claim 4 to manufacture the fine optical element.

7. A resin for imprinting, produced by a process comprising curing the curable resin composition according to claim 1.

8. A fluorinated urethane(meth)acrylate compound represented by formula (1),

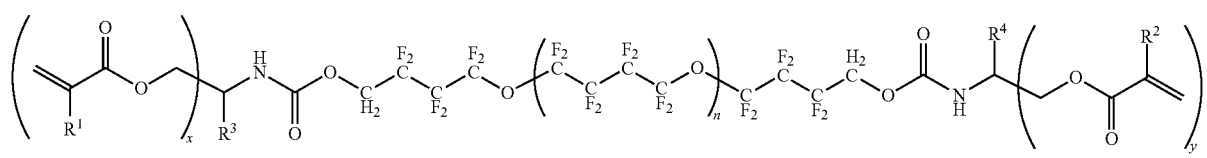

(1)

wherein:

each of $R^1$, $R^2$, $R^3$ and $R^4$ independently represents a hydrogen atom or a methyl group;

each of x and y independently represents 1 or 2, and n represents an integer within the range of 1 to 10;

each of $R^3$ and $R^4$ independently represents the hydrogen atom when x and y are both 1;

$R^3$ represents the hydrogen atom and $R^4$ represents the methyl group when x is 1 and y is 2;

$R^3$ represents the methyl group and $R^4$ represents the hydrogen atom when x is 2 and y is 1; and each of $R^3$ and $R^4$ independently represents the methyl group when x and y are both 2.

9. A photocurable resin composition comprising:

a photopolymerization initiator, and a fluorinated urethane(meth)acrylate represented by formula (1):

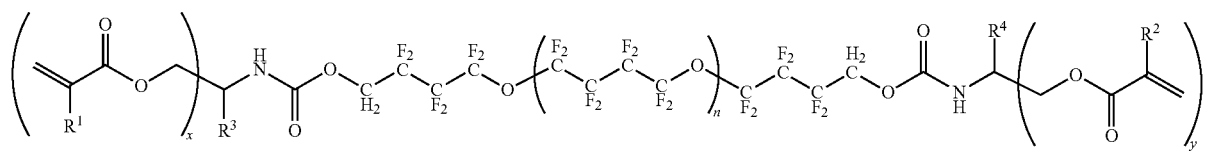

wherein:
each of $R^1$, $R^2$, $R^3$ and $R^4$ independently represents a hydrogen atom or a methyl group, x and y each independently represents 1 or 2, and n represents an integer of from 1 to 10;
each of $R^3$ and $R^4$ independently represents a hydrogen atom when x and y are both 1;
$R^3$ represents a hydrogen atom and $R^4$ represents a methyl group when x is 1 and y is 2;
$R^3$ represents a methyl group and $R^4$ represents a hydrogen atom when x is 2 and y is 1; and
each of $R^3$ and $R^4$ independently represents a methyl group when x and y are both 2.

* * * * *